United States Patent Office 3,529,961
Patented Sept. 22, 1970

3,529,961

FORMATION OF THIN FILMS OF GOLD, NICKEL OR COPPER BY PHOTOLYTIC DEPOSITION

Donald L. Schaefer and James F. Burgess, Schenectady, N.Y., assignors to General Electric Company, a corporation of New York No Drawing. Filed Dec. 27, 1966, Ser. No. 604,596
Int. Cl. G03c 5/00
U.S. Cl. 96—36.2 12 Claims

ABSTRACT OF THE DISCLOSURE

A method is disclosed whereby metallic films of gold, nickel, and copper for example may be photolytically deposited in the form of a thin coherent film upon the surface of a substrate from a liquid solution containing a source of the metal. The substrate may be either transparent or opaque and be of such diverse materials as quartz, glass, metal, or metalloids such as silicon. High resolution is obtainable and patterns such as printed circuit elements may be made in this manner.

BACKGROUND OF THE INVENTION

This invention relates to the deposition of metallic films upon the surfaces of substrates, and, more particularly, to such films which are formed as the result of a photolytic reaction.

Description of the prior art

As is well known in the art, the deposition of thin films of metallic materials on various substrates may be accomplished in a number of ways. If the substrate is electrically conductive, conventional electroplating is perhaps the commonest technique employed. If the substrate is not electrically conductive, it may be provided with a conductive coating, for example by evaporation, sputtering, or by chemically forming a mirror deposition and followed by an overlying electrodeposited layer where for one reason or another a thicker film is desired. Where it is desired to produce a pattern of deposited metal upon the substrate, for example, for decorative purposes or for "printed circuit" elements, mechanical masks or stencils have been used with the evaporation or sputtering techniques with some success provided the level or degree of resolution of the desired pattern is not too demanding. Alternatively, a uniform film may be applied to the entire substrate surface and the pattern produced therein by the use of conventional "photoresist" techniques and materials followed by etching. In short, a great many techniques are available in the art to produce patterns of metallic films on substrates, however, none are entirely satisfactory for the production of such patterns having high orders of resolution. For example, in those processes involving the use of a mask or stencil with evaporation or sputtering, the resolution is limited to the resolution of the apertures in the mask and the evaportion geometry. Furthermore, difficulty may be experienced in removing the mask without removing portions of or all of the deposited pattern. In those processes involving the use of a photoresist material and etching, difficulties may be experienced with the etchant undercutting the photoresist pattern and/or with lifting of portions of the photoresist which permits etching in areas where it is not desired. Furthermore, certain metals are extremely difficult to etch by conventional photoresist methods because the etchants which are needed also attack the photoresist materials. In any event, all these previously known techniques involve complicated mutiple step operations requiring a high level of mechanical skill to perform and under the best of conditions do not produce patterns of consistently high quality.

It is therefore a principal object of this invention to provide a single step means for photolytically depositing metallic films upon substrates.

A further object of this invention is the provision of a single step means for photolytically depositing metallic films upon substrates in high resolution patterns.

A yet further object of this invention is the provision of a single step means for photolytically depositing metallic films upon insulating substrates in the form of a printed circuit and thereby eliminate the need for expensive vacuum equipment.

Other and specifically different objects of this invention will become apparent to those skilled in the art from the disclosure which follows.

SUMMARY OF THE INVENTION

Briefly stated, and in accordance with one embodiment of the invention, the substrate to be plated upon is immersed in a liquid solution comprising a photolytically reactive material which is a source of the metal to be plated. The surface to be plated is irradiated with activating radiation and a metallic film is deposited upon those areas of the substrate which are illuminated and not upon non-illuminated areas. If the illumination is in the form of a pattern of light and dark areas produced by an image transparency having transparent and opaque areas, the deposited metallic film will correspond to the illuminated areas with a high degree of resolution. If the projected image has shade tones or "grey scale" as in the usual pictorial transparency, the thickness of the metal deposited will vary in accordance to the level of the illumination in any given area and the length of exposure time, other factors being held constant. An electric field applied to the solution during the photoplating operation appears to give improved edge resolution, but is not otherwise found to be necessary.

DESCRIPTION OF THE PREFERRED EMBODIMENTS

More specifically, the following working examples illustrate how the invention may be practiced.

Example 1

About a 0.1 molar solution of N-chlorosuccinimide (NCS) in methanol was placed in a quartz vial along with a strip of gold film on a polyethylene terephthalate plastic tape. The vial was exposed to radiation from a 200 watt high pressure xenon light source for about 15 minutes. The vial was at a distance of about three feet from the light source and a quartz flask filled with water was interposed therebetween to absorb most of the heat from the light and to act as a lens. A gold film was deposited upon the interior surface of the vial in areas of illumination.

Example 2

The same procedure recited in Example 1 was followed except that the gold film was omitted and a stock solution was used which was prepared by photolytically reacting a 0.1 molar solution of NCS in methanol with gold foil by exposing it briefly to ultraviolet radiation. The stock solution so prepared is quite stable in room light and exhibited no tendency to plate out gold over periods of several days. It has been found that the ultraviolet radiation is not necessary and that the solution becomes effective after standing in room light for a few hours, indicating that some sort of equilibrium is achieved.

Further, a test pattern transparency comprising a photographic negative having a series of transparent lines of varying width down to about 0.001 inch in an opaque background was affixed to the side of the vial which was illuminated. The film of gold plated out on the illuminated areas and reproduced the line test pattern with high edge resolution.

Example 3

The same procedure recited in Example 1 was repeated except that a chloride of gold solution in methanol was substituted for the NCS-gold foil-methanol system. Again, a gold film was deposited on areas of the vial which were illuminated.

Example 4

A cell was constructed from two glass microscope slides 3 inches long by 1 inch wide spaced about 0.1 inch apart and sealed together on three sides with room temperature vulcanizing rubber. A printed circuit pattern photographic negative was secured to the outside surface of one of the slides and a 100 mesh metal screen electrode placed in overlying contact with the transparency. A similar electrode was placed in overlying contact with the outer surface of the other slide. The cell was filled with the stock solution described in Example 2 and the transparency was illuminated for 15 minutes to the radiation from a 200 watt high pressure mercury lamp in the manner described in Example 1. During exposure, an electric field of 1000 volts was imposed across the cell between the electrodes. A film of gold was plated out on the inner surfaces of both the slides in the illuminated areas. The same procedure was repeated without the electric field and similar results were obtained, however, it appeared that the film patterns produced with the applied field had somewhat sharper edge resolution.

The NCS-gold-methanol solution and the chloride of gold in methanol solution were examined by spectrophotometrical methods and an absorption peak characteristic of $(AuCl_4)^-$ was observed. It would appear that the N-chlorosuccinimide which has the structural formula of:

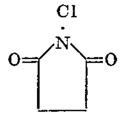

undergoes photodecomposition to produce excited chlorine which reacts with the gold to form a soluble complex chloride. It should be noted that HCl in methanol, whether photolyzed or not, does not attack gold. The soluble complex chloride is photodecomposable and plates out gold upon illuminated areas of the substrate. It should be understood, however, that the foregoing explanation is merely a hypothesis which may prove to be an oversimplification of the mechanism involved or, indeed, be entirely erroneous. It does, however, provide a plausible explanation which seems to fit all the observed phenomena.

The photoplating process is not confined to the plating of gold from NCS-gold-methanol solutions, as will be shown by the following examples.

Example 5

A dish having a flat quartz bottom was filled with a solution having the following composition:

Nickel acetate—10 grams
Sodium phyophosphite—1 gram
Hydrazine—1 gram
Methanol—3 grams
Distilled water—100 milliliters and a printed circuit negative transparency secured to the outer surface of the bottom. A 200 watt high pressure xenon lamp was used to illuminate the bottom through the transparency for about 15 minutes. A coherent nickel film was found to have plated out upon the upper surface of the bottom in those areas which had been illuminated. Again, the edge resolution of the plated film was excellent and the thickness of the deposited film appeared to be uniform.

Example 6

The procedure set forth in Example 5 was repeated except that copper acetate was substituted for the nickel acetate in the solution. After exposure a coherent copper film corresponding to the illuminated areas of the circuit pattern was deposited on the upper surface of the bottom. Again, the plated film appeared to have a uniform thickness and a high edge resolution.

In all the foregoing examples the light has been disclosed as being transmitted through a transparent substrate and a metal film being photolytically deposited from solution upon the side of the substrate exposed to the liquid. It has been found that if the substrate is immersed in the liquid in an open top dish with only a relatively thin film of the liquid over the upper surface of the substrate that satisfactory films can be deposited upon the upper surface of the substrate by projecting an image pattern of radiation vertically upon the free surface of the liquid which overlies the substrate. Gold film patterns have been photoplated in this manner upon polyethylene surfaces, glass surfaces, iron base alloy surfaces, and silicon semiconductor surfaces. Obviously, when this type of image formation is used, the substrate may be either transparent or opaque. The primary requirement of the substrate obviously is that it be dimensionally, chemically, and physically stable with respect to the environmental conditions encountered during the plating process.

From all the foregoing, it will be appreciated by those skilled in the art that the invention provides a means for the photodeposition of metals upon suitable substrates and particularly the deposition of coherent films upon electrically insulating substrates, which film deposit may be in the form of a pattern having substantially exact correspondence to a pattern of activating radiation. It will be understood that the foregoing specific working examples have been disclosed in order that a complete disclosure be made and that other and specifically different materials may be employed within the scope of the invention. Therefore, it is to be understood that the invention is not to be limited except by the scope of the following claims.

What we claim as new and desire to secure by Letters Patent of the United States is:

1. A method of plating coherent metal films upon solid substrate surfaces comprising the steps of:
   - providing a liquid containing a photodecomposable source of the metal in solution, said metal being selected from the group consisting of gold, nickel and copper,
   - immersing the substrate surface to be plated upon in said liquid solution to form a common interface, and
   - illuminating said interface with a pattern of activating radiation to photodecompose said metal source and plate a corresponding pattern of metal film upon the surface of said substrate in the illuminated zones.

2. The method recited in claim 1 wherein said liquid is metallic gold dissolved in N-chlorosuccinimide and methanol.

3. The method recited in claim 1 wherein said liquid is a chloride of gold dissolved in methanol.

4. The method recited in claim 1 wherein said photodecomposable source of the metal comprises a soluble complex chloride of gold.

5. The method recited in claim 1 wherein said liquid comprises an aqueous solution of nickel acetate.

6. The method recited in claim 1 wherein said liquid comprises an aqueous solution of copper acetate.

7. The method recited in claim 1 wherein said substrate is glass.

8. The method recited in claim 1 wherein said substrate is quartz.

9. The method recited in claim 1 wherein said substrate is a synthetic polymeric organic solid which is dimensionally, chemically, and physically stable with respect to the environmental conditions of the process.

10. The method recited in claim 1 wherein said substrate is a metallic material which is dimensionally, chemically, and physically stable with respect to the environmental conditions of the process.

11. The method recited in claim 1 wherein said substrate is a silicon semiconductor.

12. The method recited in claim 1 wherein an electric field is applied across said interface during the illumination step.

References Cited

UNITED STATES PATENTS

| | | | |
|---|---|---|---|
| 3,179,575 | 4/1965 | Dippel et al. | 204—38 |
| 3,271,180 | 9/1966 | White | 117—38 |

FOREIGN PATENTS

| | | |
|---|---|---|
| 591,291 | 1/1960 | Canada. |

GEORGE F. LESMES, Primary Examiner

M. B. WITTENBERG, Assistant Examiner

U.S. Cl. X.R.

96—36.4, 38.4; 117—212, 933; 204—15